(12) United States Patent  
Ogawa

(10) Patent No.: US 12,389,703 B2  
(45) Date of Patent: Aug. 12, 2025

(54) PHOTOELECTRIC CONVERSION DEVICE, METHOD FOR PRODUCING THE SAME, AND APPLIANCE

(71) Applicant: CANON KABUSHIKI KAISHA, Tokyo (JP)

(72) Inventor: Toshiyuki Ogawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 17/574,949

(22) Filed: Jan. 13, 2022

(65) Prior Publication Data  
US 2022/0238588 A1    Jul. 28, 2022

(30) Foreign Application Priority Data  
Jan. 22, 2021 (JP) ................. 2021-008941

(51) Int. Cl.  
H01L 27/146    (2006.01)  
H10F 39/00     (2025.01)  
(Continued)

(52) U.S. Cl.  
CPC .......... *H10F 39/811* (2025.01); *H10F 39/011* (2025.01); *H10F 71/00* (2025.01); *H10F 77/93* (2025.01)

(58) Field of Classification Search  
CPC ......... H01L 27/14636; H01L 27/14683; H01L 31/02002; H01L 31/18; H01L 31/0203; H01L 31/02327; H01L 31/107  
See application file for complete search history.

(56) References Cited

U.S. PATENT DOCUMENTS 6,093,631 A    7/2000  Jaso et al.  
6,344,409 B1   2/2002  Jaso et al.  
(Continued)

FOREIGN PATENT DOCUMENTS

JP    H11-265866 A    9/1999  
JP    2015-179817 A   10/2015  
(Continued)

OTHER PUBLICATIONS

JP 2006-140311 A, U.S. Pat. No. 9,090,783 B2.  
JP 2012-033894 A, U.S. Pat. No. 10,847,558 B2 US 2013/0105667 A1.  
JP 2018-201005 A, U.S. Pat. No. 10,446,601 B2.  
JP 2020-150128 A, U.S. Pat. No. 11,275,156 B2.  
(Continued)

*Primary Examiner* — Tony Ko  
(74) *Attorney, Agent, or Firm* — Venable LLP

(57) ABSTRACT

A photoelectric conversion device in which first and second substrates are bonded to each other is provided. The first substrate includes a first semiconductor layer having light receiving elements. The second substrate includes a second semiconductor layer having a circuit element for processing a signal generated by the light receiving elements. The photoelectric conversion device includes an electrode pad for external connection, an opening extending to the electrode pad, and a conductive pattern located between the first and second semiconductor layers. The conductive pattern includes wiring members that are used to drive the photoelectric conversion device and dummy members that are not used to drive the photoelectric conversion device. The dummy members include a dummy member located on an outer side relative to the opening in a plan view relative to a boundary between the first and second substrates.

27 Claims, 8 Drawing Sheets

(51) Int. Cl.
*H10F 71/00* (2025.01)
*H10F 77/00* (2025.01)

(56) References Cited

U.S. PATENT DOCUMENTS

| | | | |
|---|---|---|---|
| 9,184,316 | B2 | 11/2015 | Isono et al. |
| 11,244,978 | B2 | 2/2022 | Ogawa et al. |
| 11,869,853 | B2 | 1/2024 | Mitsuhashi et al. |
| 2020/0371217 | A1* | 11/2020 | Namba ................. G01S 7/497 |
| 2021/0074927 | A1 | 3/2021 | Nakanotani et al. |

FOREIGN PATENT DOCUMENTS

| | | |
|---|---|---|
| JP | 2017-120939 A | 7/2017 |
| JP | 2020-092146 A | 6/2020 |
| JP | 2020-203875 A | 12/2020 |
| WO | 2013/018280 A1 | 2/2013 |

OTHER PUBLICATIONS

WO 2020/189179 A, U.S. Pat. No. 11,804,561 B2 US 2022/0165896 A1.
JP 2020-198459 A, U.S. Pat. No. 10,355,039 B2.
US 2016/0005781 A1
JP 2017-152511 A, U.S. Pat. No. 10,665,629 B2.
JP 2019-078748 A, U.S. Pat. No. 11,579,270 B2 US 2020/0371217 A1, US 2020/0371217 A1 was cited in May 6, 2024 Notice of Allowance.
JP 2013-206921 A
US 2013/010567 A1
US 2013/0256889 A1
US 2018/0240832 A1
US 2020/0127030 A1
US 2022/0165896 A1
Office Action dated Feb. 10, 2025, in Japanese Patent Application No. 2021-008941.

* cited by examiner

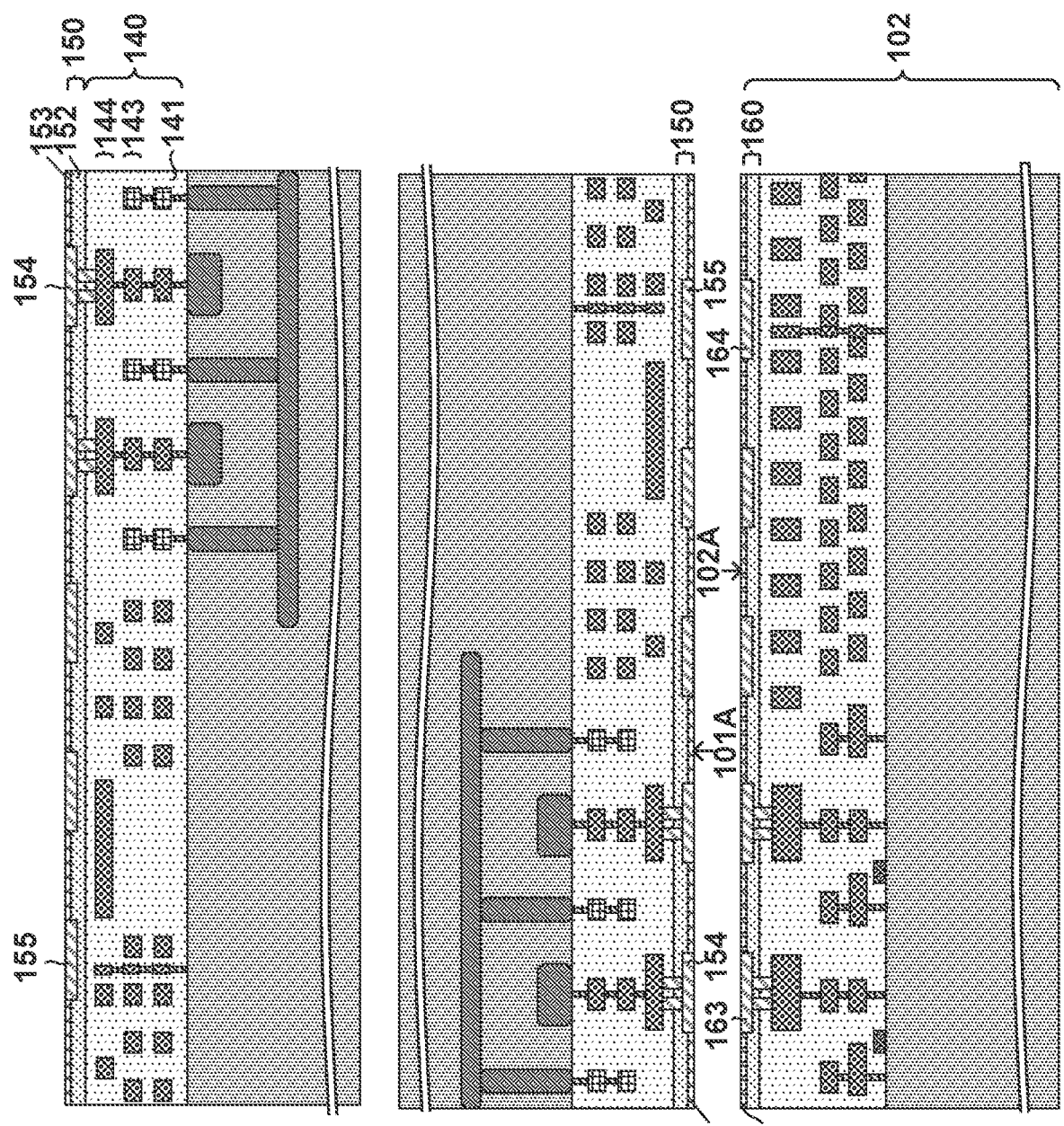

PHOTOELECTRIC CONVERSION DEVICE, METHOD FOR PRODUCING THE SAME, AND APPLIANCE

BACKGROUND OF THE INVENTION

Field of the Invention

The present disclosure relates to a photoelectric conversion device, a method for producing the same, and an appliance.

Description of the Related Art

A technique for forming a semiconductor device by sticking two semiconductor substrates together and electrically connecting the semiconductor substrates is known. Japanese Patent Laid-Open No. 2017-120939 discloses a photoelectric conversion device that is formed by sticking together a pixel substrate in which light receiving elements are formed and a circuit substrate in which a signal processing circuit is formed. Japanese Patent Laid-Open No. 11-265866 discloses a method for providing dummy wiring for improving the flatness of a wiring layer.

SUMMARY OF THE INVENTION

In the case where a photoelectric conversion device is formed by bonding two substrates, if the flatness of the bonding surfaces is low, the bondability between the two substrates may be low. Also, if the bondability of a scribing region, which is cut during dicing, is low, due to the stress applied during dicing, the bonding surfaces may be separated. Accordingly, the entire substrates, including not only a region in which circuits are disposed, but also a region in which circuits are not disposed, are required to have a high bondability. One aspect of the present disclosure provides a technique for improving the bondability between two substrates included in a photoelectric conversion device.

According to some embodiments, a photoelectric conversion device in which a first substrate and a second substrate are bonded to each other is provided. The first substrate includes a first semiconductor layer having light receiving elements, and the second substrate includes a second semiconductor layer having a circuit element for processing a signal generated by the light receiving elements. The photoelectric conversion device includes: an electrode pad for external connection; an opening extending to the electrode pad; and a conductive pattern located between the first semiconductor layer and the second semiconductor layer. The conductive pattern includes a plurality of wiring members that are used to drive the photoelectric conversion device and a plurality of dummy members that are not used to drive the photoelectric conversion device. The plurality of dummy members include a dummy member located on an outer side relative to the opening in a plan view relative to a boundary between the first substrate and the second substrate.

Further features of the present invention will become apparent from the following description of exemplary embodiments (with reference to the attached drawings).

BRIEF DESCRIPTION OF THE DRAWINGS

FIGS. 4A and 4B are diagrams illustrating the example of the production method for producing the photoelectric conversion device according to the first embodiment.

DESCRIPTION OF THE EMBODIMENTS

Figure 1:
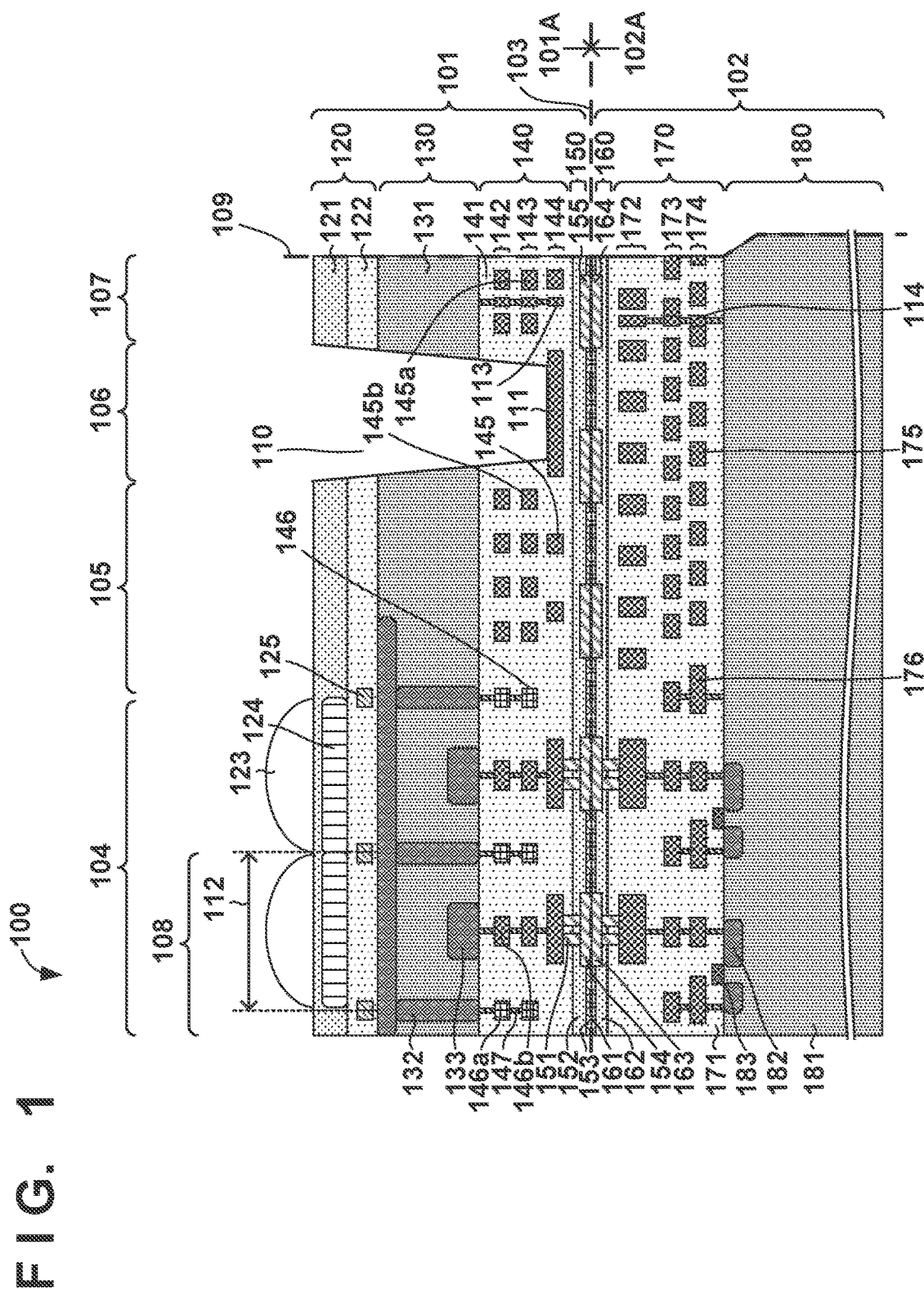
FIG. 1 is a diagram illustrating an example of a structure of a photoelectric conversion device according to a first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

An example of a structure of a photoelectric conversion device 100 according to a first embodiment of the present invention will be described with reference to FIG. 1. FIG. 1 is a cross-sectional view of the photoelectric conversion device 100, showing mainly a portion close to a side surface 109 of the photoelectric conversion device 100. The photoelectric conversion device 100 includes a pixel substrate 101 and a circuit substrate 102. The pixel substrate 101 and the circuit substrate 102 are superposed on each other, and the pixel substrate 101 and the circuit substrate 102 are bonded at a boundary 103 between the pixel substrate 101 and the circuit substrate 102. As used herein, the term "bond" means that the state in which the pixel substrate 101 and the circuit substrate 102 are superposed on each other is maintained, and may be expressed as "stick together" according to a specific bonding method.

Hereinafter, a description will be given mainly on an embodiment in which the photoelectric conversion device 100 is used to capture images. In this case, the photoelectric conversion device 100 can be used as an imaging element (image sensor) for producing images. Other examples of the photoelectric conversion device 100 include a distance measurement element (a sensor that is used for focus detection, distance measurement that uses TOF (Time Of Flight), or the like), a photometric element (a sensor that is used to measure the amount of incident light, or the like), a LiDAR (Light Detection and Ranging) sensor, and the like. The embodiment described below can be applied to photoelectric conversion devices in general.

The photoelectric conversion device 100 includes, as viewed in a plan view relative to the boundary 103, a light receiving region 104, a peripheral region 105, an opening region 106, and an outer circumferential region 107. The light receiving region 104 is a region in which a plurality of light receiving elements 108 are arranged. FIG. 1 illustrates an example in which the light receiving elements 108 are SPAD (Single Photon Avalanche Diode) sensors. Alternatively, the light receiving elements 108 may be sensors with other structures such as, for example, CMOS (Complementary Metal Oxide Semiconductor) sensors. The opening region 106 is a region in which an opening 110 that extends to an electrode pad 111 for external connection is formed. The peripheral region 105 is a region that is provided between the light receiving region 104 and the opening region 106. The outer circumferential region 107 is a region that is provided outside the opening region 106. The outer circumferential region 107 includes a side surface 109 of the photoelectric conversion device 100. The peripheral region 105 and the outer circumferential region 107 do not necessarily need to include circuit elements that are used to drive the photoelectric conversion device 100.

The pixel substrate 101 includes an optical layer 120, a semiconductor layer 130, a wiring layer 140, and a bonding layer 150. A bonding surface 101A of the pixel substrate 101 is bonded to the circuit substrate 102. Hereinafter, a configuration of each of the layers included in the pixel substrate 101 will be described specifically.

The semiconductor layer 130 includes a semiconductor substrate 131 in which the plurality of light receiving elements 108 are formed. The semiconductor substrate 131 is made using, for example, silicon as a material. The semiconductor substrate 131 includes impurity regions 132 and 133. The impurity region 132 functions as the anode for the SPAD sensors. The impurity region 133 functions as the cathode for the SPAD sensors. As described above, the light receiving elements 108 are configured with the impurity regions 132 and 133. A voltage with a large difference from the ground potential (for example, a voltage of about −30 V) is applied to the impurity region 132 (anode) when the SPAD sensors are driven. On the other hand, a voltage of about 1 V is applied to the impurity region 133 (cathode). The voltages applied to the impurity regions are not limited to these values as long as the values are those for which avalanche multiplication is possible in the light receiving elements 108. For example, a voltage of 0 V may be applied to the anode, and a voltage of about 30 V may be applied to the cathode.

There are two modes in the case where a reverse bias voltage is applied: a geiger mode in which an operation is performed in a state in which the potential difference between the anode and the cathode is larger than a breakdown voltage; and a linear mode in which an operation is performed in a state in which the potential difference between the anode and the cathode is near the breakdown voltage, or lower than the breakdown voltage. APDs that are operated in the geiger mode are called SPADs. APDs require a large voltage as compared with photodiodes that do not perform avalanche multiplication. The light receiving elements 108 of the present embodiment may be operated in the linear mode or in the geiger mode. SPADs are advantageous in that the potential difference is larger as compared with the APDs operated in the linear mode, and a significant withstand voltage effect is obtained.

The wiring layer 140 includes an interlayer insulating film 141, a plurality of conductive patterns 142 to 144 that are embedded in the interlayer insulating film 141, and a plurality of vias 147. Each of the plurality of vias 147 connects different conductive patterns to each other, or connects a conductive pattern and an impurity region to each other. In the example shown in FIG. 1, three conductive patterns 142 to 144 are shown, but the number of conductive patterns is not limited thereto. Among the three conductive patterns 142 to 144, the conductive pattern 144 is the closest to the boundary 103, the conductive pattern 143 is the second closest to the boundary 103, and the conductive pattern 142 is the third closest to the boundary 103 (or in other words, most distant from the boundary 103). In other words, the conductive pattern 143 is more distant from the boundary 103 than the conductive pattern 144, and the conductive pattern 142 is more distant from the boundary 103 than the conductive pattern 143. The conductive patterns 142 to 144 may be made using aluminum as a material.

Each of the conductive patterns 142 to 144 includes a plurality of conductive members that are used to drive the photoelectric conversion device 100 and a plurality of conductive members that are not used to drive the photoelectric conversion device 100. As used herein, the expression "a plurality of conductive members that are used to drive the photoelectric conversion device 100" may refer to conductive members that are used to transmit signals or supply electric power to drive the photoelectric conversion device 100. The expression "a plurality of conductive members that are not used to drive the photoelectric conversion device 100" may refer to conductive members that are not used to transmit signals or supply electric power to drive the photoelectric conversion device 100.

Hereinafter, the conductive members that are used to drive the photoelectric conversion device 100 will be referred to as "wiring members 146", and the conductive members that are not used to drive the photoelectric conversion device 100 will be referred to as "dummy members 145". In the description given below, the term "wiring member 146" may be used as a collective term for a plurality of wiring members, and thus subscripts may be used to distinguish individual wiring members such as 146a. Likewise, the term "dummy member 145" may be used as a collective term for a plurality of dummy members, and thus subscripts may be used to distinguish individual dummy members such as 145a. In FIG. 1, out of the members included in the plurality of conductive patterns 142 to 144, those that are connected to the vias 147 are wiring members 146, and those that are not connected to the vias 147 are dummy members 145.

The plurality of wiring members 146 include wiring members 146a that are electrically connected to the impurity region 132 (anode) and wiring members 146b that are electrically connected to the impurity region 133 (cathode). The wiring members 146a and the wiring members 146b are both included in the conductive pattern 142 that is the closest to the semiconductor layer 130 among the plurality of conductive patterns 142 to 144.

The conductive pattern 142 and the conductive pattern 143 may have the same planar layout. By stacking conductive patterns that have the same planar layout, and connecting the conductive patterns to each other using vias, wiring resistance can be reduced while the thickness of the conductive patterns is kept at a thickness that can be micromachined. In the case where the light receiving elements 108 are SPAD sensors that require a large current, it is advantageous to reduce the wiring resistance as described above. The number of conductive patterns that have the same planar layout may be two as in the present embodiment, or may be more than two.

A plurality of dummy members 145 in the plurality of conductive patterns 142 to 144 include, as viewed in a plan view relative to the boundary 103, dummy members that are provided on the outer side relative to the opening 110 (for example, dummy members 145a that are provided in the outer circumferential region 107). Furthermore, the plurality of dummy members 145 in the plurality of conductive patterns 142 to 144 may include, as viewed in a plan view relative to the boundary 103, dummy members that are provided on the inner side relative to the opening 110 (for example, dummy members 145b that are provided in the peripheral region 105). The conductive pattern 144 further includes an electrode pad 111 for external connection. As described above, the electrode pad 111 is exposed to outside through the opening 110. A bonding wire is connected to the electrode pad 111 when the photoelectric conversion device 100 is packaged.

The electrode pad 111 may be made using aluminum as a material so that wire bonding can be performed. Other members (for example, the wiring members 146 and the dummy members 145) included in the conductive pattern 144 may also be made using aluminum as a material. In doing so, all of the members included in the conductive pattern 144 can be collectively processed. As a result, the number of steps included in the production method for producing the photoelectric conversion device 100 can be reduced.

In the photoelectric conversion device 100, the electrode pad 111 is formed in the pixel substrate 101. Accordingly, electric power can be supplied from the electrode pad 111 to the impurity region 132 (anode) via the wiring members 146a (anode connecting members) without the electric power flowing through the circuit substrate 102. In an SPAD sensor, a high voltage of about −30 V that is a voltage with a large difference from the ground potential is applied to the anode. There is no need to provide a signal path for applying a high voltage as described above in the circuit substrate 102, and thus the degree of freedom in the circuit layout of the circuit substrate 102 is improved.

The wiring layer 140 may further include an annular moisture-resistant ring 113 that surrounds the opening 110. FIG. 1 shows only a portion of the moisture-resistant ring 113 that is located on the outer side relative to the opening 110. The plurality of dummy members 145 in the plurality of conductive patterns 142 to 144 may include, as viewed in a plan view relative to the boundary 103, dummy members that are provided on the outer side relative to the moisture-resistant ring 113 (dummy members 145a that are provided between the moisture-resistant ring 113 and the side surface 109).

The bonding layer 150 includes vias 151, a barrier film 152, a bonding film 153, and a plurality of electrodes. The plurality of electrodes face the boundary 103. The plurality of electrodes include a plurality of electrodes that are used to drive the photoelectric conversion device 100 and a plurality of electrodes that are not used to drive the photoelectric conversion device 100. Hereinafter, the electrodes that are used to drive the photoelectric conversion device 100 will be referred to as "wiring electrodes 154", and the electrodes that are not used to drive the photoelectric conversion device 100 will be referred to as "dummy electrodes 155". In FIG. 1, out of the plurality of electrodes that face the boundary 103, those that are connected to the vias 151 are wiring electrodes 154, and those that are not connected to the vias 151 are dummy electrodes 155. The vias 151 connect the wiring electrodes 154 to the conductive pattern 144. The wiring electrodes 154, the dummy electrodes 155, and the vias 151 are made using, for example, copper as a material.

The bonding film 153 is disposed around the plurality of electrodes, and insulates the plurality of electrodes from each other. The bonding film 153 faces the boundary 103. The bonding film 153 is made using, for example, an oxide as a material. The barrier film 152 is provided between the wiring layer 140 and the bonding film 153. The barrier film 152 is made using, for example, a nitride as a material. The barrier film 152 prevents copper that is used as the electrode material, from diffusing into the semiconductor layer 130.

The optical layer 120 includes an optical interlayer film 122, optical separation members 125, a color filter interlayer film 121, a color filter 124, and microlenses 123. The optical separation members 125 are embedded in the optical interlayer film 122. Each optical separation member 125 suppresses color mixing between adjacent light receiving elements 108. The color filter 124 is embedded in the color filter interlayer film 121. The microlenses 123 condensate incident light from the optical layer 120 (the upper side in FIG. 1) to the light receiving elements 108.

The circuit substrate 102 includes a semiconductor layer 180, a wiring layer 170, and a bonding layer 160. A bonding surface 102A of the circuit substrate 102 is bonded to the pixel substrate 101. The circuit substrate 102 includes a signal processing circuit for processing signals generated by the light receiving elements 108. The signal processing circuit includes circuit elements (for example, transistors) for processing signals generated by the light receiving elements 108.

The semiconductor layer 180 includes a semiconductor substrate 181. The semiconductor substrate 181 is made using, for example, silicon as a material. An impurity region 182 is formed in the semiconductor substrate 181. Also, gate electrodes 183 are formed to cover portions of the surface of the semiconductor substrate 181.

The wiring layer 170 includes an interlayer insulating film 171, a plurality of conductive patterns 172 to 174 that are embedded in the interlayer insulating film 171, and a plurality of vias. The wiring layer 170 has the same configuration as that of the wiring layer 140, except that the electrode pad 111 is not included. In the wiring layer 170 as well, each of the plurality of conductive patterns 172 to 174 includes a plurality of conductive members (wiring members 176) that are used to drive the photoelectric conversion device 100 and a plurality of conductive members (dummy members 175) that are not used to drive the photoelectric conversion device 100. Also, the plurality of dummy members 175 in the plurality of conductive patterns 172 to 174 include, as viewed in a plan view relative to the boundary 103, dummy members that are provided on the outer side relative to the opening 110. The plurality of dummy members 175 in the plurality of conductive patterns 172 to 174 include, as viewed in a plan view relative to the boundary 103, dummy members that are provided on the inner side relative to the opening 110.

As with the wiring layer 140, the wiring layer 170 may further include a moisture-resistant ring 114. FIG. 1 shows only a portion of the moisture-resistant ring 114. The plurality of dummy members 175 in the plurality of conductive patterns 172 to 174 may include, as viewed in a plan view relative to the boundary 103, dummy members that are provided on the outer side relative to the moisture-resistant ring 114 (dummy members that are provided between the moisture-resistant ring 114 and the side surface 109).

The bonding layer 160 includes a bonding film 161, a barrier film 162, and a plurality of electrodes. The plurality of electrodes include a plurality of electrodes (wiring electrodes 163) that are used to drive the photoelectric conversion device 100 and a plurality of electrodes (dummy electrodes 164) that are not used to drive the photoelectric conversion device 100. The bonding layer 160 has the same configuration as that of the bonding layer 150, and thus a redundant description is omitted.

The pixel substrate 101 and the circuit substrate 102 are bonded to each other as a result of the bonding film 153 and the bonding film 161 being bonded, the wiring electrodes 154 and the wiring electrodes 163 being bonded, and the dummy electrodes 155 and the dummy electrodes 164 being bonded.

In the pixel substrate 101, the plurality of conductive patterns 142 to 144 include the dummy members 145, and thus, as will be described later, the flatness of the bonding surface 101A of the pixel substrate 101 is improved. Likewise, in the circuit substrate 102, the plurality of conductive patterns 172 to 174 include the dummy members 175, and thus the flatness of the bonding surface 102A of the circuit substrate 102 is also improved. For this reason, the bondability at the boundary 103 when the pixel substrate 101 and the circuit substrate 102 are bonded is improved, and gaps formed between the pixel substrate 101 and the circuit substrate 102 can be reduced. For this reason, it is possible to, for example, suppress the occurrence of cracks due to the load applied when wire bonding is performed on the electrode pad 111.

At least one of the dummy electrodes 155 is disposed at an overlapping position with the electrode pad 111 as viewed in a plan view relative to the boundary 103. By disposing at least one dummy electrode 155 as described above, the bondability between the two substrates is further improved, and the bonding strength between the pixel substrate 101 and the circuit substrate 102 in the opening region 106 is further improved. In another embodiment, at least one dummy electrode 155 does not necessarily need to be disposed at an overlapping position with the electrode pad 111.

Furthermore, at least one of the dummy members 175 of the circuit substrate 102 is disposed at an overlapping position with the electrode pad 111 as viewed in a plan view relative to the boundary 103. By disposing at least one dummy member 175 as described above, the bondability between the two substrates is further improved. In another embodiment, at least one dummy member 175 does not necessarily need to be disposed at an overlapping position with the electrode pad 111.

Figure 2A:
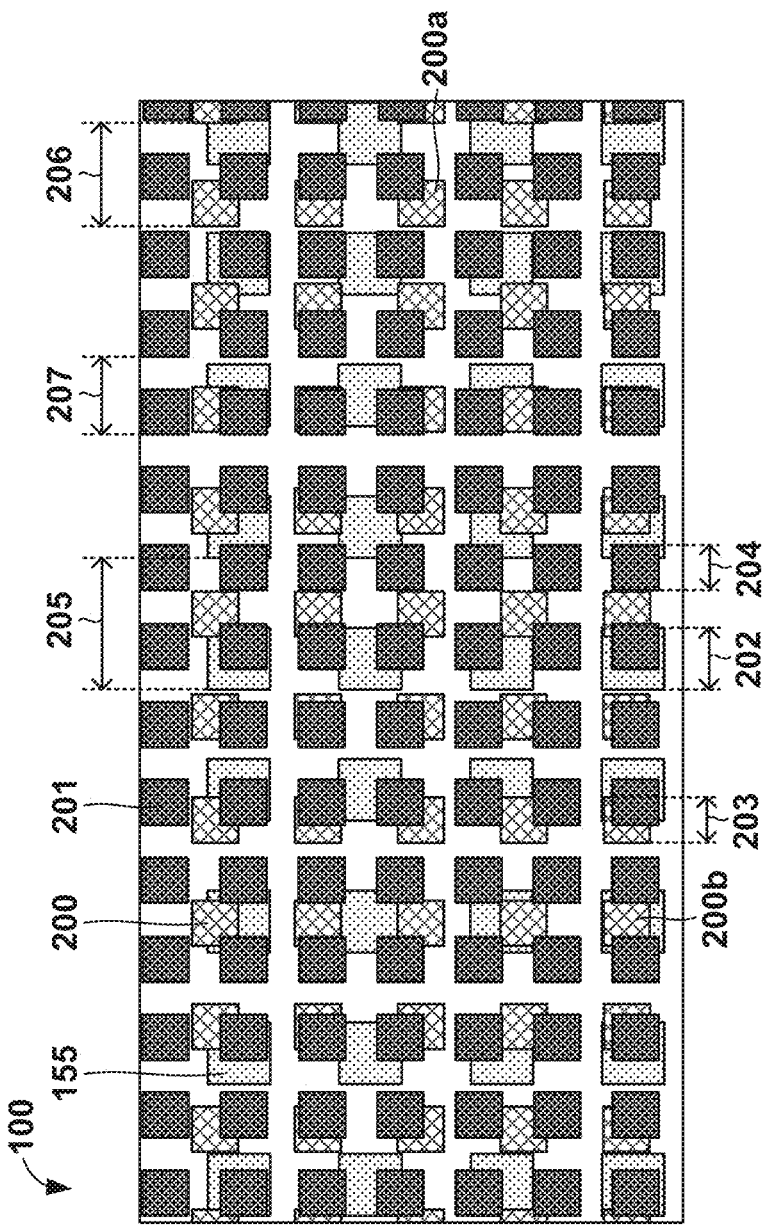
FIGS. 2A to 2C are diagrams illustrating examples of a planar layout of the photoelectric conversion device according to the first embodiment.
Figure 2C:
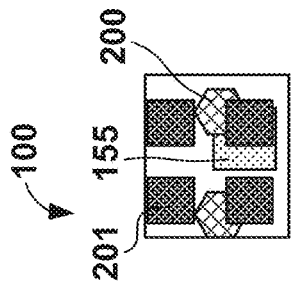
Figure 2B:

The planar layouts of the conductive patterns 142 to 144 will be described with reference to FIGS. 2A to 2C. As described above, the planar layout of the conductive pattern 142 and the planar layout of the conductive pattern 143 may be the same, and thus a description of the planar layout the conductive pattern 143 is omitted in the following description. In FIGS. 2A to 2C, out of the dummy members 145, those that are included in the conductive pattern 144 will be referred to as "dummy members 200", and those that are included in the conductive pattern 142 will be referred to as "dummy members 201".

As shown in FIGS. 2A to 2C, the plurality of dummy electrodes 155, the plurality of dummy members 200, and the plurality of dummy members 201 are disposed in a periodic lattice configuration. By disposing the dummy members in a periodic lattice configuration as described above, the dummy electrodes or the dummy members can be mechanically arranged. In FIG. 2A, the dummy electrodes 155, the dummy members 200, and the dummy members 201 each have a square shape as viewed in a plan view relative to the boundary 103.

Each dummy electrode 155 has a width 202 (a side length in the case where the dummy electrodes 155 have a square shape) in a range of, for example, 2.7 μm to 3.3 μm, and may have a width 202 of, for example, 3.0 μm. An arrangement pitch 205 between the plurality of dummy electrodes 155 is in a range of, for example, 6.0 μm to 6.8 μm, and may be, for example, 6.39 μm.

Each dummy member 200 has a width 203 (a side length in the case where the dummy members 200 have a square shape) in a range of, for example, 2.0 μm to 2.4 μm, and may have a width 203 of, for example, 2.2 μm. An arrangement pitch 206 between the plurality of dummy members 200 is in a range of, for example, 3.5 μm to 4.1 μm, and may be, for example, 3.8 μm.

Each dummy member 201 has a width 204 (a side length in the case where the dummy members 201 have a square shape) in a range of, for example, 2.0 μm to 2.4 μm, and may have a width 204 of, for example, 2.2 μm. An arrangement pitch 207 between the plurality of dummy members 201 is in a range of, for example, 4.5 μm to 5.5 μm, and may be, for example, 5.0 μm.

In general, the arrangement pitch 205 may be larger than the arrangement pitch 206. Alternatively, the arrangement pitch 205 may be less than or equal to the arrangement pitch 206. The arrangement pitch 205 may be larger than the arrangement pitch 207. Alternatively, the arrangement pitch 205 may be less than or equal to the arrangement pitch 207. The arrangement pitch 206 may be larger than the arrangement pitch 207. Alternatively, the arrangement pitch 206 may be less than or equal to the arrangement pitch 207. The arrangement pitch between the plurality of dummy members 145 of the conductive pattern 142 may be equal to the arrangement pitch between the plurality of dummy members 145 of the conductive pattern 143. At least one of the arrangement pitch 206 and the arrangement pitch 207 may be smaller than an arrangement pitch 112 between the plurality of light receiving elements 108.

In general, each dummy electrode 155 may have an area larger than the area of each dummy member 200 as viewed in a plan view relative to the boundary 103. Alternatively, each dummy electrode 155 may have an area less than or equal to the area of each dummy member 200. Each dummy member 200 may have an area equal to the area of each dummy member 201 as viewed in a plan view relative to the boundary 103. Alternatively, each dummy member 200 may have an area different from the area of each dummy member 201.

In general, as viewed in a plan view relative to the boundary 103, the area density of the plurality of dummy members 200 included in the conductive pattern 144 may be smaller than the area density of the plurality of dummy members 201 included in the conductive pattern 143. As viewed in a plan view relative to the boundary 103, the area density of the dummy members 201 included in the conductive pattern 143 may be substantially equal to the area density of the wiring members 146 included in the conductive pattern 143 (for example, with an error of less than 5%). By configuring the dummy members 201 and the wiring members 146 to have substantially the same area density, the flatness of the upper surface of the wiring layer 140 can be further improved. Alternatively, the dummy members 201 and the wiring members 146 do not necessarily need to have substantially the same area density. For example, the area density of the dummy members 201 included in the conductive pattern 143 may be larger than the area density of the wiring members 146 included in the same conductive pattern 143. In this case, intrusion light entering from the side surface 109 and passing through the wiring layer 140 can be easily suppressed by the dummy members 201. Conversely, the area density of the dummy members 201 included in the conductive pattern 143 may be smaller than the area density of the wiring member 146 included in the same conductive pattern 143. In this case, the wiring layer 140 in the light receiving region 104 is thicker than the wiring layer 140 in other regions. For this reason, the bondability of the wiring electrodes 154 of the pixel substrate 101 with the wiring electrodes 163 of the circuit substrate 102 is improved. The same relationship may be established between the area density of the dummy members 200 included in the conductive pattern 144 and the area density of the wiring members 146 included in the same conductive pattern 144.

The plurality of dummy members 200 may include dummy members (for example, dummy members 200*b*) that each entirely overlap any one of the plurality of dummy electrodes 155 and dummy members (for example, dummy members 200*a*) that each do not overlap any one of the plurality of dummy electrodes 155. Alternatively, the plurality of dummy members 200 may include only either one type of dummy members.

In the example described above as illustrated in FIG. 2A, the dummy members 145 have a square shape as viewed in a plan view relative to the boundary 103. Alternatively, the dummy members 145 may have other shapes as viewed in a plan view relative to the boundary 103. For example, the dummy members 145 may each have a circular shape (as illustrated in FIG. 2B) or a polygonal shape (as illustrated in FIG. 2C) with all apexes defining an obtuse angle as viewed in a plan view relative to the boundary 103. By configuring the dummy members 145 to have a shape as described above, even when wiring members to which a high voltage is applied are provided near the dummy members 145, electric field concentration of the dummy members 145 is alleviated, and the withstand voltage between conductive members is improved.

Next, an example of a production method for producing the photoelectric conversion device 100 will be described with reference to FIGS. 3A to 5B. In the method described below, a plurality of photoelectric conversion devices 100 are formed by separately forming two semiconductor wafers, bonding the semiconductor wafers together, and dicing the bonded semiconductor wafers. The pixel substrate 101 before dicing (in a state in which the pixel substrate 101 is not separated into the plurality of photoelectric conversion devices 100) is also referred to as "pixel substrate 101". Likewise, the circuit substrate 102 before dicing (in a state in which the circuit substrate 102 is not separated into the plurality of photoelectric conversion devices 100) is also referred to as "circuit substrate 102".

Figure 3A:
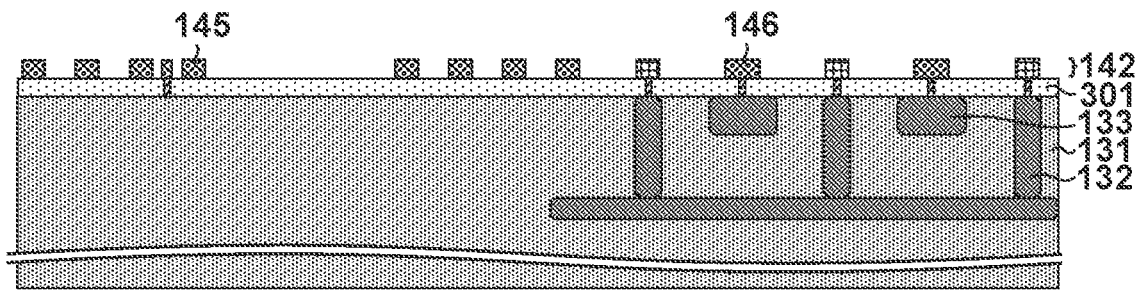
FIGS. 3A to 3D are diagrams illustrating an example of a production method for producing the photoelectric conversion device according to the first embodiment.

First, impurity regions 132 and 133 are formed in a semiconductor substrate 131, and an interlayer insulating film 301 is formed on the semiconductor substrate 131. After that, vias that extend through the interlayer insulating film 301 are formed, and a conductive pattern 142 that includes wiring members 146 and dummy members 145 is formed on the interlayer insulating film 301. In this way, a structural body as shown in FIG. 3A is formed. The dummy members 145 are disposed in a region other than the region in which the wiring members 146 are disposed. The conductive pattern 142 is formed by, for example, forming an aluminum film by sputtering or the like, and thereafter performing photolithography and dry etching thereon.

Figure 3B:
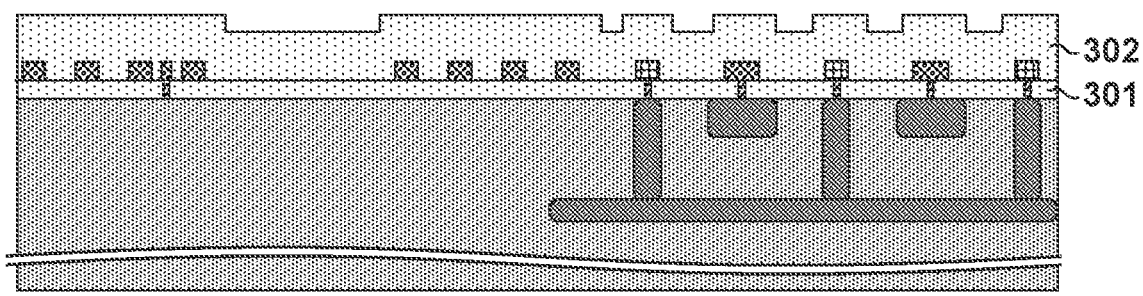

After that, an interlayer insulating film 302 is further formed on the conductive pattern 142, and a structural body as shown in FIG. 3B is thereby formed. The interlayer insulating film 302 may be formed using, for example, plasma CVD (Chemical Vapor Deposition) or the like. The upper surface of the interlayer insulating film 302 has irregularities due to the influence of the conductive pattern 142.

Figure 3C:
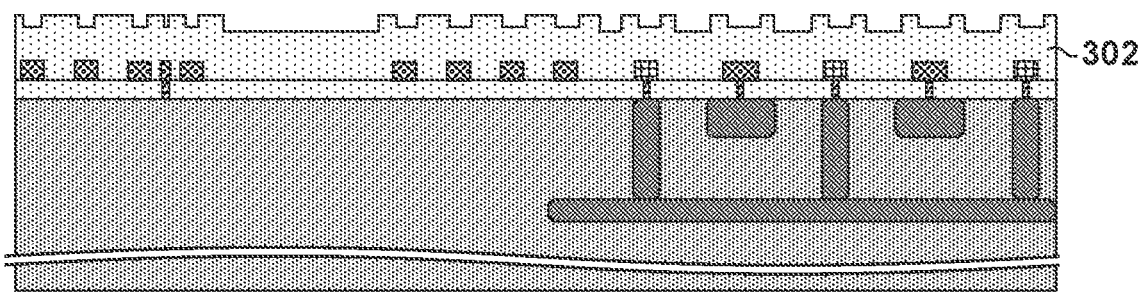

After that, a portion of the interlayer insulating film 302 is removed by performing etching from the upper surface of the interlayer insulating film 302 to reduce the spacing between irregularities of the interlayer insulating film 302. In this way, a structural body as shown in FIG. 3C is formed. For etching, for example, photolithography, dry etching, and the like can be used.

Figure 3D:
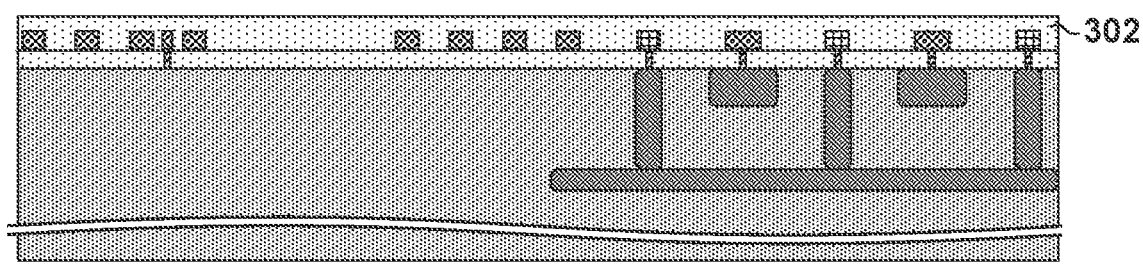

After that, the upper surface of the interlayer insulating film 302 is flattened by, for example, performing CMP (Chemical Mechanical Polishing) or the like. In this way, a structural body as shown in FIG. 3D is formed. Because the conductive pattern 142 includes dummy members 145, the flatness of the upper surface of the interlayer insulating film 302 is improved as compared with the case where the dummy members 145 are not included.

After that, the same process is repeatedly performed to sequentially form conductive patterns 143 and 144, and a wiring layer 140 is thereby formed. As a result of the plurality of interlayer insulating films 301 and 302, and the like being sequentially formed, an interlayer insulating film 141 is formed. After that, a bonding layer 150 is formed, and a structural body as shown in FIG. 4A is formed. Separately from forming the structural body, a circuit substrate 102 is also formed in the same manner.

After that, as shown in FIG. 4B, the structural body shown in FIG. 4A prepared in the manner described above and the circuit substrate 102 are superposed on each other such that the bonding layer 150 and the bonding layer 160 oppose each other, and the structural body shown in FIG. 4A and the circuit substrate 102 are bonded. After that, the semiconductor substrate 131 is thinned, and an optical layer 120 is formed. After that, an opening 110 that extends to an electrode pad 111 is formed. In this way, a structural body as shown in FIG. 5A is formed.

Figure 5A:
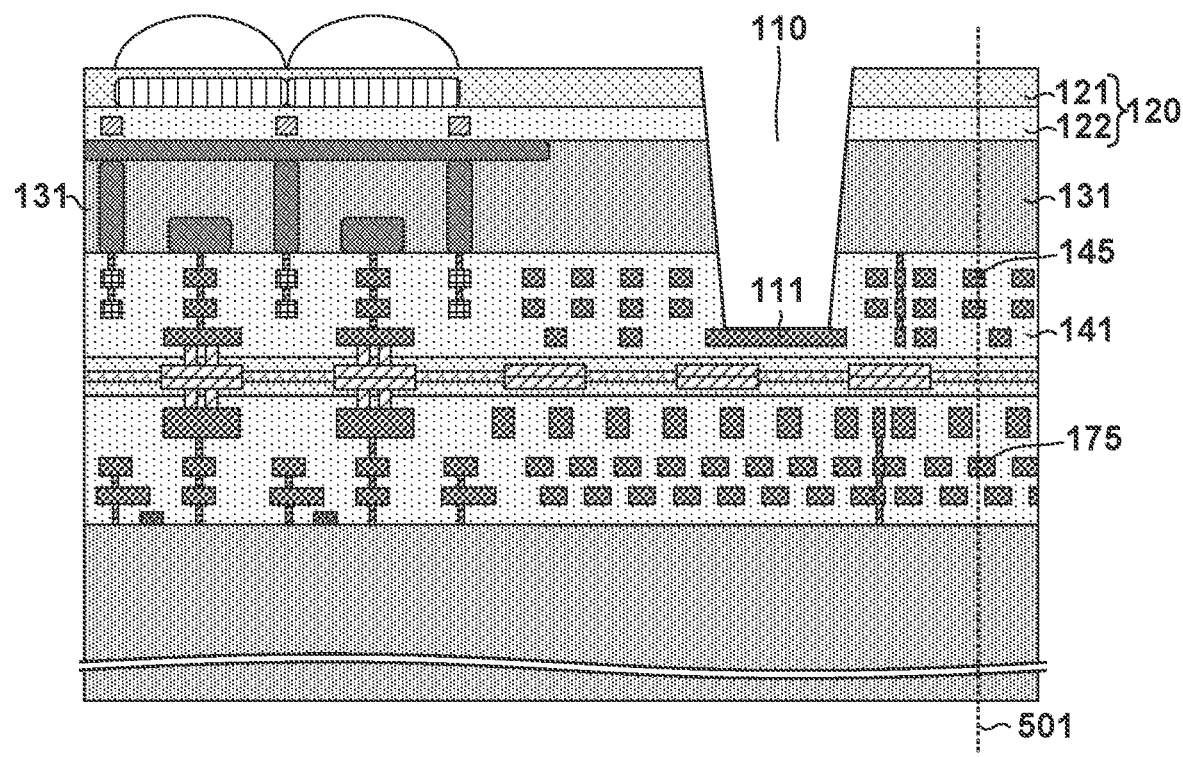
FIGS. 5A and 5B are diagrams illustrating the example of the production method for producing the photoelectric conversion device according to the first embodiment.
Figure 5B:
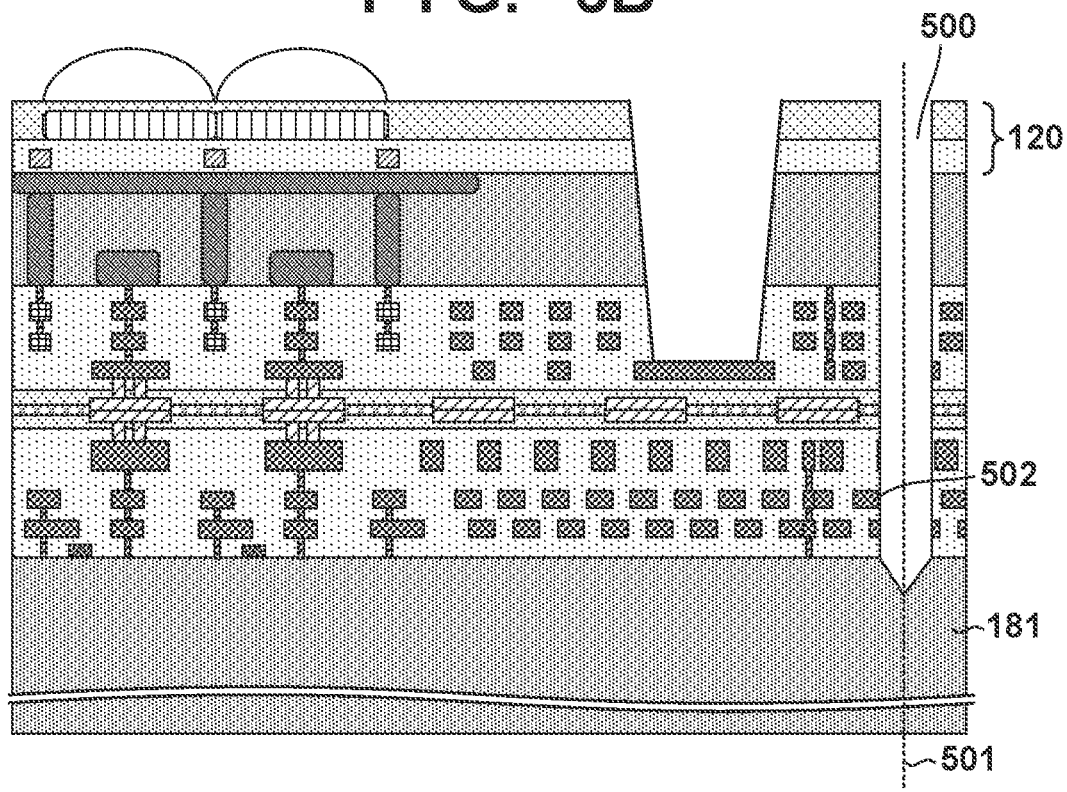

In FIG. 5A, a dicing line 501 for dicing the semiconductor wafers is shown. The dicing line 501 passes through the dummy members 145 and 175. Accordingly, when the semiconductor wafers are diced along the dicing line 501, due to the influence of the dummy members 145 and 175, chipping may occur. To address this, before dicing, a groove 500 that extends along the dicing line 501 may be formed. In the example shown in the diagram, the groove 500 is formed from the optical layer 120 side, but the groove 500 may be formed from the opposite side of the optical layer 120. The groove 500 extends to, for example, the semiconductor substrate 181 of the circuit substrate 102. The groove 500 is formed by performing processing that uses heat such as, for example, laser processing. After the groove 500 has been formed, residues 502 formed as a result of portions of the dummy members 175 being removed are left in the photoelectric conversion device 100 (specifically, the wiring layer 170). Although not shown in the diagram, residues formed as a result of portions of the dummy members 145 being removed may be left in the photoelectric conversion device 100 (specifically, the wiring layer 140). After that, the structural body shown in FIG. 5B is diced along the dicing line 501, and a plurality of photoelectric conversion devices 100 are thereby obtained.

Figure 6A:
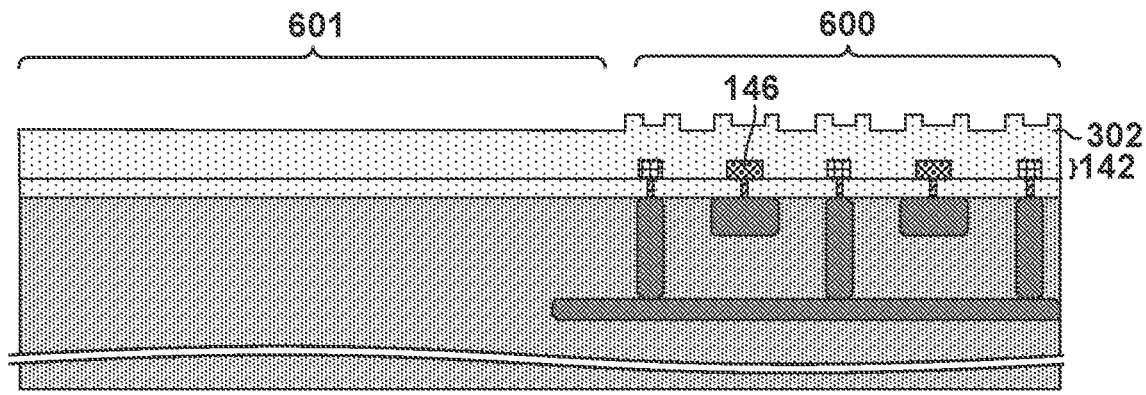
FIGS. 6A to 6C are diagrams illustrating an example of a structure of a photoelectric conversion device according to a comparative example.

A production method for producing a photoelectric conversion device according to a comparative example will be described with reference to FIGS. 6A to 6C. FIG. 6A shows a step that corresponds to FIG. 3C. In the comparative example, the conductive pattern 142 includes wiring members 146, but does not include dummy members 145. Accordingly, a region 600 in which light receiving elements 108 are formed includes conductive members, but a region 601 other than the region 600 does not include conductive members.

Figure 6B:
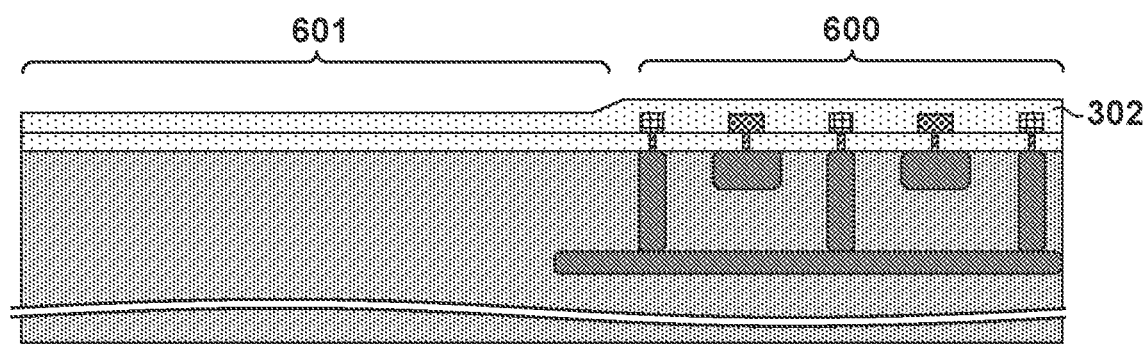

After that, as shown in FIG. 6B, the upper surface of the interlayer insulating film 302 is flattened. The amount of the interlayer insulating film 302 abraded in the region 601 is larger than the amount of the interlayer insulating film 302 abraded in the region 600, and thus the flatness of the upper surface of the interlayer insulating film 302 is low. Specifically, the interlayer insulating film 302 in the region 601 is thinner than the interlayer insulating film 302 in the region 600.

Figure 6C:
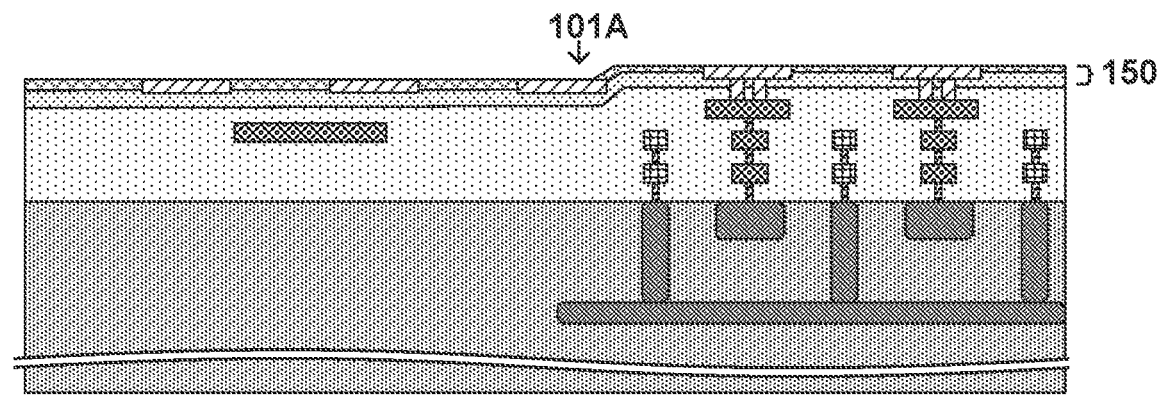

After that, as shown in FIG. 6C, an additional conductive pattern and a bonding layer 150 are formed. In the additional conductive pattern as well, dummy members 145 are not formed, and thus a large height difference is formed. Accordingly, the flatness of the bonding surface according to the comparative example is lower than the flatness of the bonding surface 101A (FIG. 4A) of the pixel substrate 101 according to the first embodiment. The flatness of the upper surface of the bonding layer 160 of the circuit substrate 102 of the comparative example that is formed in the same manner is also lower than the flatness of the upper surface of the bonding layer 160 of the photoelectric conversion device 100 of the first embodiment. For this reason, when the pixel substrate and the circuit substrate that both have upper surfaces with low flatness are bonded, gaps may be formed therebetween, causing a bonding failure. In the photoelectric conversion device 100, dummy members 145 are also provided in the region 601 in which wiring members 146 are not provided, and thus the flatness of the bonding surface can be improved.

In the photoelectric conversion device 100 according to the first embodiment, each of the plurality of conductive patterns 142 to 144 of the pixel substrate 101 includes dummy members 145. Alternatively, only a portion of the plurality of conductive patterns 142 to 144 may include dummy members 145. Even when only a portion of the plurality of conductive patterns 142 to 144 includes dummy members 145, the flatness of the bonding surface 101A is improved as compared with the case where dummy members 145 are not included at all. Likewise, only a portion of the plurality of conductive patterns 172 to 174 of the circuit substrate 102 may include dummy members 175. Also, a configuration may be used in which the pixel substrate 101 includes dummy members 145, and the circuit substrate 102 does not include dummy members 175, or vice versa. As long as any one of a plurality of conductive patterns provided between the semiconductor layer 130 of the pixel substrate 101 and the semiconductor layer 180 of the circuit substrate 102 includes dummy members, the bondability between the two substrates is improved as compared with the case where none of the conductive patterns includes dummy members.

In the photoelectric conversion device 100, the light receiving region 104 does not include dummy members 145. Alternatively, the light receiving region 104 may include dummy members 145. By also providing dummy members 145 in the light receiving region 104 as described above, the area density of the conductive members in the conductive patterns can be easily adjusted, and thus the flatness of the bonding surface 101A is further improved. In order to facilitate disposing dummy members 145 in the light receiving region 104, the width (the width 203 or the width 204) of each dummy member 145 may be less than or equal to half the arrangement pitch 112 between the plurality of light receiving elements 108. In addition thereto, the arrangement pitch (the arrangement pitch 206 or the arrangement pitch 207) between the plurality of dummy members 145 may be less than or equal to half the arrangement pitch 112 between the plurality of light receiving elements 108.

As described above, a voltage of about −30 V that is a voltage with a large difference from the ground potential is applied to the wiring members 146a that are connected to the anodes of the SPAD sensors. Accordingly, in order to ensure the withstand voltage, a dummy member 145 may not be provided between a wiring member 146a and a wiring member 146b in the vicinity of the wiring member 146a. For example, as shown in FIG. 1, the spacing between a wiring member 146a and a wiring member 146b is less than or equal to the arrangement pitch between the plurality of light receiving elements 108 (less than or equal to the arrangement pitch 112). For this reason, a dummy member that is not used to drive the photoelectric conversion device 100 may not be provided between the wiring member 146a and the wiring member 146b.

In the photoelectric conversion device 100, vias are not connected to the dummy members 145. For this reason, the positions of the dummy members 145 are not affected by the positions of the dummy members 145 in other layers, and thus the degree of freedom in the layout of the dummy members 145 is improved. Alternatively, vias may be connected to the dummy members 145. Likewise, in the photoelectric conversion device 100, vias are not connected to the dummy electrodes 155. For this reason, the positions of the dummy electrodes 155 are not affected by the positions of the dummy members 145, and thus the degree of freedom in the layout of the dummy electrodes 155 is improved. Alternatively, vias may be connected to the dummy electrodes 155.

Second Embodiment

Figure 7:
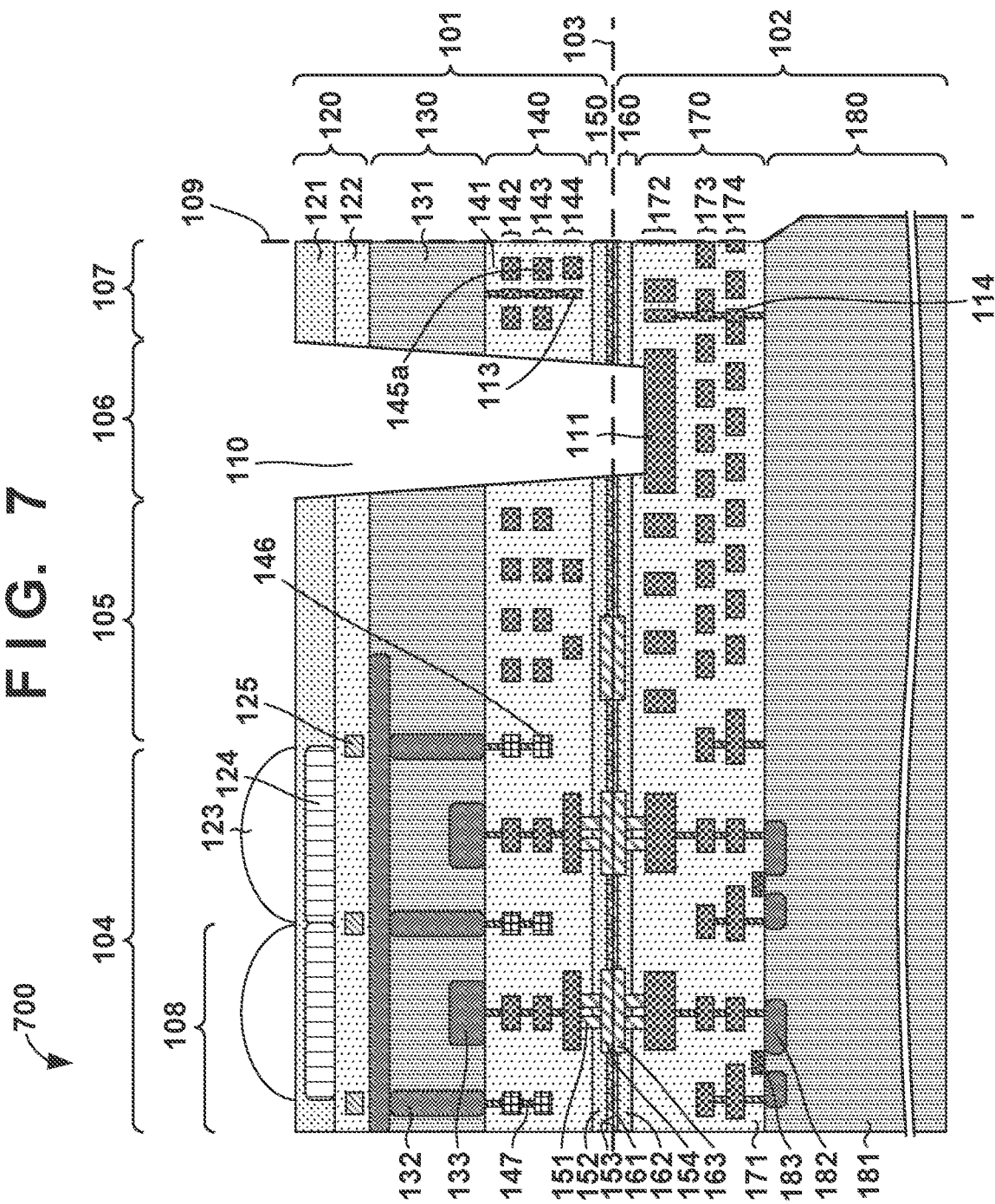
FIG. 7 is a diagram illustrating an example of a structure of a photoelectric conversion device according to a second embodiment.

An example of a structure of a photoelectric conversion device 700 according to a second embodiment of the present invention will be described with reference to FIG. 7. Hereinafter, a description will be given focusing mainly on differences from the first embodiment. The matters that are not described below may be the same as those of the first embodiment. FIG. 7 shows a cross-sectional view of the photoelectric conversion device 700 at a position corresponding to FIG. 1.

In the photoelectric conversion device 700 according to the second embodiment, an electrode pad 111 is formed in a circuit substrate 102. Accordingly, an opening 110 extends into a portion of the circuit substrate 102 through a pixel substrate 101. Dummy electrodes 155 and 164 are not formed in an opening region 106 at a position at which the opening 110 is formed.

As a result of the electrode pad 111 being provided in the circuit substrate 102, the distance of wiring between the electrode pad 111 and the signal processing circuit provided in the circuit substrate 102 can be shortened. Accordingly, a signal delay can be reduced.

Other Embodiments

Figure 8A:
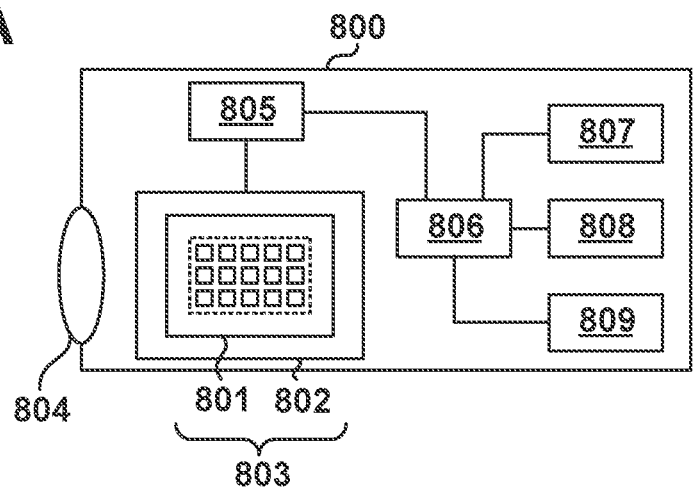
FIGS. 8A to 8C are diagrams illustrating an example of a configuration of an appliance according to a third embodiment.

An embodiment of an appliance 800 that includes a semiconductor device 803 will be described in detail with reference to FIG. 8A. The semiconductor device 803 may be either one of the photoelectric conversion devices described in the embodiments given above. The semiconductor device 803 may include a semiconductor device 801 and a package 802 that houses the semiconductor device 801. The package 802 may include a substrate to which the semiconductor device 801 is fixed, and a cover such as a glass cover that opposes the semiconductor device 801. The package 802 may further include a bonding member, such as a bonding wire or a bump, that connects a terminal provided in the substrate and a terminal (bonding pad) provided in the semiconductor device 801.

The appliance 800 may include at least one of an optical device 804, a control device 805, a processing device 806, a display device 807, a storage device 808, and a mechanical device 809. The optical device 804 is, for example, a lens, a shutter, or a mirror. The control device 805 controls the semiconductor device 803. The control device 805 is, for example, a semiconductor device such as an FPGA (Field Programmable Gate Array) or an ASIC (Application Specific Integrated Circuit).

The processing device 806 processes a signal output from the semiconductor device 803. The processing device 806 is a semiconductor device such as a CPU (Central Processing Unit), an ASIC, or the like for constituting an AFE (analog front end) or a DFE (digital front end). The display device 807 is an EL (Electro-Luminescent) display device or a liquid crystal display device that displays information (images) obtained by the semiconductor device 803. The storage device 808 is a magnetic device or a semiconductor device that stores information (images) obtained by the semiconductor device 803. The storage device 808 is a volatile memory such as an SRAM (Static Random Access Memory) or a DRAM (Dynamic Random Access Memory), or a non-volatile memory such as a flash memory or a hard disk drive.

The mechanical device 809 includes a movable unit or a propulsion unit such as a motor, an engine, or the like. The appliance 800 displays a signal output from the semiconductor device 803 on the display device 807, or transmits the signal to the outside via a communication device (not shown) included in the appliance 800. For this reason, the appliance 800 may further include a storage device 808 and a processing device 806 in addition to a storage circuit and an arithmetic circuit that are included in the semiconductor device 803. The mechanical device 809 may be controlled based on a signal output from the semiconductor device 803.

The appliance 800 is suitable for an electronic appliance such as an information terminal (for example, a smartphone or a wearable terminal) that has an image capturing function, or a camera (for example, an interchangeable lens camera, a compact camera, a video camera, or a surveillance camera). In the case of a camera, the mechanical device 809 may drive the components of the optical device 804 to perform a zooming operation, a focusing operation, and a shutter operation. Alternatively, in the case of a camera, the mechanical device 809 may move the semiconductor device 803 to perform a vibration damping operation.

Alternatively, the appliance 800 may be a transport appliance such as a vehicle, a ship, or an aircraft. In the case of a transport appliance, the mechanical device 809 may be used as a moving device. The appliance 800 used as a transport appliance may transport the semiconductor device 803, or perform driving (steering) assistance and/or automation using the image capturing function. The processing device 806 for performing driving (steering) assistance and/or automation may perform processing for operating the mechanical device 809 used as a moving device based on information obtained by the semiconductor device 803. Alternatively, the appliance 800 may be a medical appliance such as an endoscope, a measurement appliance such as an analysis distance measurement sensor, an analysis appliance such as an electron microscope, or an office appliance such as a copying machine.

Figure 8B:
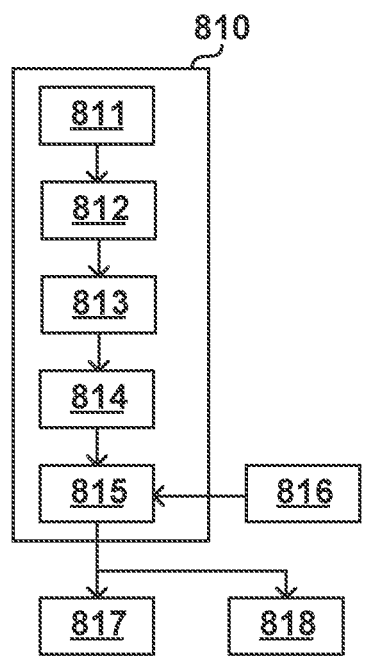
Figure 8C:
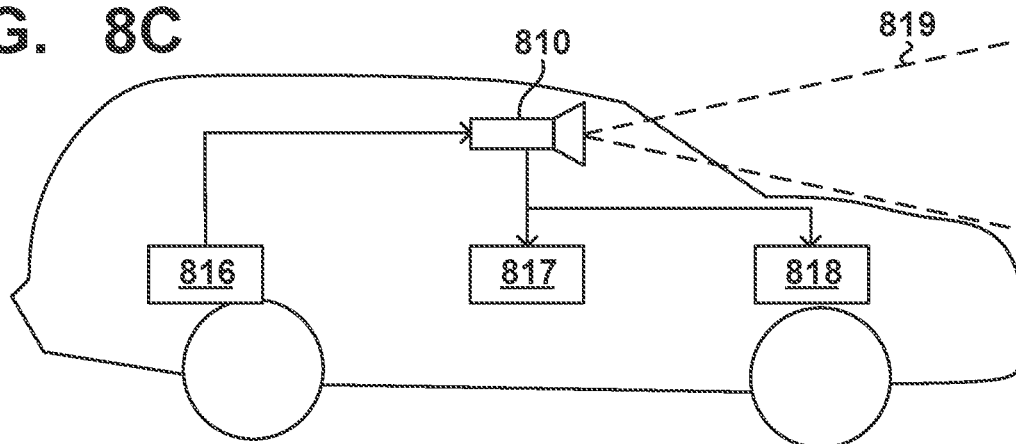

An image capturing system and a mobile body according to an embodiment will be described with reference to FIGS. 8B and 8C. FIG. 8B shows an example of an image capturing system 810 of an in-vehicle camera. The image capturing system 810 includes a photoelectric conversion device 811. The photoelectric conversion device 811 may be any of the photoelectric conversion devices described in the embodiments given above. The image capturing system 810 includes an image processing unit 812 that is a processing device that performs image processing on a plurality of image data items acquired by the photoelectric conversion device 811. Also, the image capturing system 810 includes a parallax acquiring unit 813 that is a processing device that calculates a parallax (a phase difference between parallax images) from a plurality of image data items acquired by the photoelectric conversion device 811. Furthermore, the image capturing system 810 includes a distance acquiring unit 814 that is a processing device that calculates the distance to a target object based on the calculated parallax, and a collision determination unit 815 that is a processing device that determines, based on the calculated parallax, whether or not there is a possibility of a collision. Here, the parallax acquiring unit 813 and the distance acquiring unit 814 are examples of an information acquiring unit that acquires information such as distance information regarding the distance to a target object. The distance information includes information regarding parallax, defocus amount, the distance to a target object, and the like. The collision determination unit 815 may determine the possibility of a collision based on any one of the distance information items. The various types of processing devices described above may be implemented using specifically designed hardware, or general-purpose hardware that performs arithmetic operations based on a software module. Also, the processing devices may be implemented using FPGA, ASIC, or the like, or a combination thereof.

The image capturing system 810 is connected to a vehicle information acquiring device 816, and thus can acquire vehicle information such as vehicle speed, yaw rate, and steering angle. Also, the image capturing system 810 is connected to a control ECU 817 that is a control device that outputs a control signal that causes the vehicle to generate a braking force based on the result of determination performed by the collision determination unit 815. In short, the control ECU 817 is an example of a mobile body control unit that controls the mobile body based on the distance information. Also, the image capturing system 810 is also connected to a warning device 818 that provides a warning to the driver based on the result of determination performed by the collision determination unit 815. For example, if it is determined, as a result of determination performed by the collision determination unit 815, that there is a high possibility of a collision, the control ECU 817 controls the vehicle to brake, deaccelerate, or suppress the engine output so as to avoid the collision or reduce damage. The warning device 818 provides a warning to the user by providing a warning sound, displaying warning information on a screen such as the screen of a car navigation system, vibrating the seat belts or the steering wheel, or the like.

In the present embodiment, the image capturing system 810 captures images of the surroundings of the vehicle such as, for example, the front or the back of the vehicle. FIG. 8C shows the image capturing system 810 in the case where the image capturing system 810 is configured to capture images of the front of the vehicle (an image capturing range 819). The vehicle information acquiring device 816 transmits an instruction to cause the image capturing system 810 to operate and capture images.

In the description given above, an example has been described in which control is performed to prevent the vehicle from colliding with another vehicle, but the embodiment is also applicable to the case where control is performed to cause the vehicle to follow another vehicle and autonomously drive, the case where control is performed to cause the vehicle to autonomously drive while preventing the vehicle from deviating from the lane, or other cases. Furthermore, the application of the image capturing system is not limited to a vehicle such as an automobile, and the image capturing system is applicable to a mobile body (transport appliance) such as, for example, a ship, an aircraft, or an industrial robot. In the case of a mobile body (transport appliance), the moving device is any type of moving unit such as an engine, a motor, wheels, or a propeller. In addition, the application is not limited to a mobile body, and the image capturing system is widely applicable to an appliance that utilizes object recognition such as an intelligent transportation system (ITS).

The embodiments described above can be changed as appropriate without departing from the technical ideas of the present disclosure. The content disclosed in the specification of the present application encompasses not only the matters explicitly described in the specification of the present application, but also all matters that can be understood from the specification of the present application and the drawings attached to the specification. Also, the content disclosed in the specification of the present application encompasses a complementary set of the concept described in the specification of the present application. Specifically, for example, the expression "A is larger than B" in the specification of the present application is intended to also disclose "A is not larger than B" even when the expression "A is not larger than B" is not explicitly included in the specification of the present application. This is because when the expression "A is larger than B" is explicitly included in the specification of the present application, it is based on the assumption that consideration is also given to the case where "A is not larger than B". Claims are attached to publicly disclose the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-008941, filed Jan. 22, 2021, which is hereby incorporated by reference herein in its entirety.

What is claimed is:

1. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
   an electrode pad for external connection;
   an opening extending to the electrode pad; and
   a conductive pattern located between the first semiconductor layer and the second semiconductor layer,
   wherein the conductive pattern includes a plurality of wiring members that are used to drive the photoelectric conversion device and a plurality of dummy members that are not used to drive the photoelectric conversion device,
   the plurality of dummy members include a dummy member located on an outer side relative to the opening in a plan view relative to a boundary between the first substrate and the second substrate, and
   the plurality of dummy members include a dummy member not connected to a via.

2. The photoelectric conversion device according to claim 1,
   wherein the first substrate includes a plurality of conductive patterns between the boundary and the first semiconductor layer,
   each of the plurality of conductive patterns includes a plurality of dummy members that are not used to drive the photoelectric conversion device, and
   the plurality of dummy members included in each of the plurality of conductive patterns include a dummy member located on the outer side relative to the opening in a plan view relative to the boundary.

3. The photoelectric conversion device according to claim 2,
   wherein the first substrate includes a plurality of dummy electrodes that face the boundary and are not used to drive the photoelectric conversion device, and
   the plurality of conductive patterns included in the first substrate include a first conductive pattern, a second conductive pattern that is more distant from the boundary than the first conductive pattern, and a third conductive pattern that is more distant from the boundary than the second conductive pattern.

4. The photoelectric conversion device according to claim 3,
   wherein an arrangement pitch between the plurality of dummy electrodes is larger than an arrangement pitch between the plurality of dummy members in the first conductive pattern.

5. The photoelectric conversion device according to claim 3,
   wherein an arrangement pitch between the plurality of dummy electrodes is larger than an arrangement pitch between the plurality of dummy members in the third conductive pattern.

6. The photoelectric conversion device according to claim 3,
   wherein an arrangement pitch between the plurality of dummy members in the first conductive pattern is larger than an arrangement pitch between the plurality of dummy members in the third conductive pattern.

7. The photoelectric conversion device according to claim 3,
wherein an arrangement pitch between the plurality of dummy members in the second conductive pattern is equal to an arrangement pitch between the plurality of dummy members in the third conductive pattern.

8. The photoelectric conversion device according to claim 3,
wherein an arrangement pitch between the plurality of dummy electrodes is larger than an arrangement pitch between the plurality of dummy members in the first conductive pattern, and
an arrangement pitch between the plurality of dummy members in the first conductive pattern is larger than an arrangement pitch between the plurality of dummy members in the second conductive pattern.

9. The photoelectric conversion device according to claim 3,
wherein one dummy electrode of the plurality of dummy electrodes has an area larger than an area of one dummy member of the plurality of dummy members in the first conductive pattern in a plan view relative to the boundary.

10. The photoelectric conversion device according to claim 3,
wherein the plurality of dummy members in the first conductive pattern include a dummy member that entirely overlaps one of the plurality of dummy electrodes, and a dummy member that does not overlap any one of the plurality of dummy electrodes in a plan view relative to the boundary.

11. The photoelectric conversion device according to claim 3,
wherein an area density of the plurality of dummy members in the first conductive pattern is smaller than an area density of the plurality of dummy members in the second conductive pattern or the third conductive pattern in a plan view relative to the boundary.

12. The photoelectric conversion device according to claim 1,
wherein the plurality of dummy members include a dummy member located on an inner side relative to the opening in a plan view relative to the boundary.

13. The photoelectric conversion device according to claim 1,
wherein the conductive pattern is made using aluminum as a material.

14. The photoelectric conversion device according to claim 1,
wherein the light receiving elements are single photon avalanche diode sensors.

15. The photoelectric conversion device according to claim 1,
wherein the plurality of wiring members include a first wiring member connected to an anode of the light receiving elements and a second wiring member connected to a cathode of the light receiving elements,
a spacing between the first wiring member and the second wiring member is less than or equal to an arrangement pitch between the light receiving elements, and
a dummy member that is not used to drive the photoelectric conversion device is not included between the first wiring member and the second wiring member.

16. The photoelectric conversion device according to claim 1,
wherein the plurality of dummy members include a dummy member that has a circular shape in a plan view relative to the boundary.

17. The photoelectric conversion device according to claim 1,
wherein the plurality of dummy members include a dummy member that has a polygonal shape with all apexes defining an obtuse angle in a plan view relative to the boundary.

18. The photoelectric conversion device according to claim 1,
wherein the plurality of dummy members include a dummy member that has a width less than or equal to half an arrangement pitch between the light receiving elements.

19. The photoelectric conversion device according to claim 1,
wherein an arrangement pitch between the plurality of dummy members is smaller than an arrangement pitch between the light receiving elements.

20. The photoelectric conversion device according to claim 1,
wherein an area density of the plurality of dummy members is different from an area density of the plurality of wiring members in a plan view relative to the boundary.

21. An appliance comprising:
the photoelectric conversion device according to claim 1; and
at least one of the following devices:
an optical device for the photoelectric conversion device;
a control device configured to control the photoelectric conversion device;
a processing device configured to process a signal output from the photoelectric conversion device;
a display device configured to display information obtained by the photoelectric conversion device;
a storage device configured to store information obtained by the photoelectric conversion device; and
a mechanical device configured to operate based on information obtained by the photoelectric conversion device.

22. A method for producing a photoelectric conversion device, the method comprising:
preparing a first substrate and a second substrate, the first substrate including a first semiconductor layer having light receiving elements, and the second substrate including a second semiconductor layer having a circuit element for processing a signal generated by the light receiving elements;
bonding the first substrate and the second substrate to each other;
forming an opening for external connection that extends to an electrode pad;
forming a groove along a dicing line by performing processing that uses heat; and
after forming the groove along the dicing line, dicing the first substrate and the second substrate along the dicing line,
wherein at least one of the first substrate and the second substrate prepared includes a conductive pattern,
the conductive pattern includes a plurality of wiring members that are used to drive the photoelectric conversion device, and a plurality of dummy members that are not used to drive the photoelectric conversion device, and
the plurality of dummy members include a dummy member that is located on an outer side relative to the opening in a plan view relative to a boundary between the first substrate and the second substrate.

23. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
an electrode pad for external connection;
an opening extending to the electrode pad; and
a conductive pattern located between the first semiconductor layer and the second semiconductor layer,
wherein the conductive pattern includes a plurality of wiring members that are used to drive the photoelectric conversion device and a plurality of dummy members that are not used to drive the photoelectric conversion device,
the plurality of dummy members include a dummy member located on an outer side relative to the opening in a plan view relative to a boundary between the first substrate and the second substrate, and
an area density of the plurality of dummy members is different from an area density of the plurality of wiring members in a plan view relative to the boundary.

24. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
an electrode pad for external connection;
an opening extending to the electrode pad; and
a conductive pattern located between the first semiconductor layer and the second semiconductor layer,
wherein the conductive pattern includes a plurality of wiring members that are used to drive the photoelectric conversion device and a plurality of dummy members that are not used to drive the photoelectric conversion device,
the plurality of dummy members include a dummy member located on an outer side relative to the opening in a plan view relative to a boundary between the first substrate and the second substrate,
the first substrate includes a plurality of conductive patterns between the boundary and the first semiconductor layer,
each of the plurality of conductive patterns includes a plurality of dummy members that are not used to drive the photoelectric conversion device,
the plurality of dummy members included in each of the plurality of conductive patterns include a dummy member located on the outer side relative to the opening in a plan view relative to the boundary,
the first substrate includes a plurality of dummy electrodes that face the boundary and are not used to drive the photoelectric conversion device, and
the plurality of conductive patterns included in the first substrate include a first conductive pattern, a second conductive pattern that is more distant from the boundary than the first conductive pattern, and a third conductive pattern that is more distant from the boundary than the second conductive pattern.

25. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
an electrode pad for external connection;
an opening extending to the electrode pad; and
a conductive pattern located between the first semiconductor layer and the second semiconductor layer,
wherein the conductive pattern includes a plurality of wiring members that are used to drive the photoelectric conversion device and a plurality of dummy members that are not used to drive the photoelectric conversion device,
the plurality of dummy members include a dummy member located on an outer side relative to the opening in a plan view relative to a boundary between the first substrate and the second substrate,
the plurality of wiring members include a first wiring member connected to an anode of the light receiving elements and a second wiring member connected to a cathode of the light receiving elements,
a spacing between the first wiring member and the second wiring member is less than or equal to an arrangement pitch between the light receiving elements, and
a dummy member that is not used to drive the photoelectric conversion device is not included between the first wiring member and the second wiring member.

26. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
an electrode pad for external connection;
an opening extending to the electrode pad; and
a conductive pattern located between the first semiconductor layer and the second semiconductor layer,
wherein the conductive pattern includes a plurality of wiring members that are used to drive the photoelectric conversion device and a plurality of dummy members that are not used to drive the photoelectric conversion device,
the plurality of dummy members include a dummy member located on an outer side relative to the opening in a plan view relative to a boundary between the first substrate and the second substrate, and
the plurality of dummy members include a dummy member that has a circular shape in a plan view relative to the boundary.

27. A photoelectric conversion device in which a first substrate and a second substrate are bonded to each other, the first substrate including a first semiconductor layer having light receiving elements, and the second substrate including a second semiconductor layer having a circuit element for processing a signal generated by the light receiving elements, the photoelectric conversion device comprising:
an electrode pad for external connection;
an opening extending to the electrode pad; and
a conductive pattern located between the first semiconductor layer and the second semiconductor layer, wherein the conductive pattern includes a plurality of wiring members that are used to drive the photoelectric conversion device and a plurality of dummy members that are not used to drive the photoelectric conversion device, the plurality of dummy members include a dummy member located on an outer side relative to the opening in a plan view relative to a boundary between the first substrate and the second substrate, and the plurality of dummy members include a dummy member that has a polygonal shape with all apexes defining an obtuse angle in a plan view relative to the boundary.

* * * * *